United States Patent
Hawtof et al.

(10) Patent No.: US 9,859,477 B2
(45) Date of Patent: Jan. 2, 2018

(54) METHOD OF FORMING LIGHT EMITTING DIODE WITH HIGH-SILICA SUBSTRATE

(71) Applicant: Corning Incorporated, Corning, NY (US)

(72) Inventors: Daniel Warren Hawtof, Corning, NY (US); Archit Lal, Ithaca, NY (US); Xinghua Li, Horseheads, NY (US); Hisham Menkara, Kennesaw, GA (US); William Judson Ready, IV, Atlanta, GA (US); Brent Karl Wagner, Marietta, GA (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/403,912

(22) Filed: Jan. 11, 2017

(65) Prior Publication Data
US 2017/0207372 A1  Jul. 20, 2017

Related U.S. Application Data

(60) Provisional application No. 62/279,269, filed on Jan. 15, 2016.

(51) Int. Cl.
*H01L 33/00* (2010.01)
*H01L 33/50* (2010.01)
*H01L 33/48* (2010.01)

(52) U.S. Cl.
CPC .......... *H01L 33/507* (2013.01); *H01L 33/483* (2013.01); *H01L 33/502* (2013.01); *H01L 2933/0033* (2013.01); *H01L 2933/0041* (2013.01)

(58) Field of Classification Search
CPC ...... H01L 33/507; H01L 33/502; H01L 33/48; H01L 2933/0033; H01L 2933/0041
See application file for complete search history.

(56) References Cited

U.S. PATENT DOCUMENTS

| | | | |
|---|---|---|---|
| 7,629,400 B2 | 12/2009 | Hyman | |
| 8,459,840 B2 * | 6/2013 | Ishimori | C04B 35/44 362/293 |
| 2004/0062699 A1 * | 4/2004 | Oshio | C04B 35/01 423/263 |
| 2005/0288813 A1 * | 12/2005 | Yang | B22F 3/1055 700/119 |
| 2008/0030976 A1 * | 2/2008 | Murazaki | C03C 3/064 362/84 |

(Continued)

OTHER PUBLICATIONS

Bechtel et al.; "Lumiramic: a new phosphor technology for high performance solid state light sources"; Proc. SPIE vol. 7058, Eighth International Conference on Solid State Lighting, 70580E (Sep. 2, 2008); pp. 1-10.

(Continued)

*Primary Examiner* — Nikolay Yushin
(74) *Attorney, Agent, or Firm* — Dinsmore & Shohl LLP

(57) ABSTRACT

A method of making an LED device and an LED device using a high-silica, fully-sintered glass substrate is provided. The high-silica substrate is at least 99% silica and is thin, such as less than 200 μm in thickness. A phosphor containing layer is deposited on to the substrate and is laser sintered on the substrate such that a portion of the sintered phosphor layer embeds in the material of the substrate.

20 Claims, 3 Drawing Sheets

(56) References Cited

U.S. PATENT DOCUMENTS

| | | | |
|---|---|---|---|
| 2009/0153022 A1 | 6/2009 | Hussell et al. | |
| 2010/0307552 A1* | 12/2010 | Kohnke | H01L 31/02168 |
| | | | 136/243 |
| 2011/0090703 A1* | 4/2011 | Ishimori | C04B 35/44 |
| | | | 362/311.02 |
| 2013/0177998 A1 | 7/2013 | Hong et al. | |
| 2015/0111328 A1 | 4/2015 | Huang et al. | |
| 2015/0140706 A1 | 5/2015 | Chen et al. | |
| 2015/0188001 A1 | 7/2015 | Schricker et al. | |
| 2016/0045841 A1* | 2/2016 | Kaplan | B01J 19/0093 |
| | | | 429/49 |
| 2016/0225966 A1* | 8/2016 | Maloney | H01L 33/502 |

OTHER PUBLICATIONS

Lo, et al.; "Multilayer dispensing of remote phosphor for LED wafer level packaging with pre-formed silicone lens"; Electronics System-Integration Technology Conference (ESTC), Sep. 2014; pp. 1-6.

Lee et al.; "Screen Printing of Yellow Phosphor Powder on Blue Light Emitting Diode (LED) Arrays for White Light Illumination," Proc. InterPACK'07, Vancouver, Canada, Jul. 8-12, 2007.

\* cited by examiner

METHOD OF FORMING LIGHT EMITTING DIODE WITH HIGH-SILICA SUBSTRATE

This application claims the benefit of priority under 35 U.S.C. §119 of U.S. Provisional Application Ser. No. 62/279,269, filed on Jan. 15, 2016, the content of which is relied upon and incorporated herein by reference in its entirety.

BACKGROUND

The disclosure relates generally to high-silica content substrate materials, and specifically to high-silica content substrate materials for use in light emitting diode (LEDs) formation methods. Silica soot may be generated by a process, such as flame hydrolysis. The silica soot may then be sintered to form a fully or partially sintered high-silica content substrate. LEDs include a diode which generates light and a phosphor layer which absorbs at least some of the light from the LED and generates light at different wavelengths. The LED and phosphor layer are supported by a substrate.

SUMMARY

One embodiment of the disclosure relates to a method of forming a light-emitting diode device. The method includes providing a high-silica content, sintered glass substrate. The substrate includes a first major surface, a second major surface opposite the first major surface, at least 99% SiO2 by weight, an average thickness between the first major surface and the second major surface of less than 200 μm and a minimum dimension orthogonal to the thickness that is less than 100 m and greater than 1 mm. The method includes applying a phosphor containing layer directly onto the first major surface such that at least some of a phosphor material of the phosphor containing layer directly contacts the first major surface. The method includes providing a sintering laser positioned to direct a laser beam onto the phosphor containing layer. The method includes sintering the phosphor material of the phosphor containing layer by delivering a laser beam from the sintering laser to the phosphor containing layer forming a sintered phosphor layer. During sintering, at least a portion of the substrate softens such that an inner portion of the sintered phosphor layer embeds in a transition section of the substrate below and adjoining the first major surface. The method includes applying a cover glass layer over the phosphor containing layer and coupling a light-emitting diode to the substrate.

An additional embodiment of the disclosure relates to a method of forming a light-emitting diode device. The method includes providing a high-silica content, fully-sintered glass substrate. The substrate includes a first major surface, a second major surface opposite the first major surface, at least 99% SiO2 by weight, a density greater than 1.8 g/cc and less than about 2.2 g/cc, and an average thickness between the first major surface and the second major surface of less than 100 μm. The substrate bends to a radius of curvature of at least 500 mm without fracture when at room temperature of 25 C. The substrate has a softening point temperature greater than 1100° C. The substrate has a low coefficient of thermal expansion less than 10×10−7/° C. in the temperature range of about 50 to 300° C. The method includes applying a phosphor material onto the first major surface of the substrate. The phosphor material comprising phosphor particles having a maximum width of between 5 μm and 50 μm. The method includes sintering the phosphor material directly onto the first major surface of the substrate by directing a laser beam onto an interface between the phosphor material and the first major surface forming a sintered phosphor layer. The method includes coupling a light-emitting diode and the substrate together.

An additional embodiment of the disclosure relates to a silica-based, high-power light emitting diode device. The device includes a high-silica content, sintered glass substrate. The substrate includes a first major surface, a second major surface opposite the first major surface, at least 99% SiO2 by weight, an average thickness between the first major surface and the second major surface of less than 200 μm and a minimum dimension orthogonal to the thickness that is less than 100 m and greater than 1 mm. The device includes a sintered phosphor layer located on and embedded into the substrate at the first major surface. The sintered phosphor layer includes an outer surface, and an inner boundary located within the substrate and below the first major surface. The sintered phosphor layer includes a transition zone extending from the inner boundary a portion of the distance towards the outer surface, and the transition zone includes sintered phosphate material embedded in the material of the substrate. The sintered phosphor layer an external phosphor zone extending from the transition zone to the outer surface, and the external phosphor zone is located outside of the material of the substrate. The device a light-emitting diode device coupled to the substrate, and the light emitting diode device is configured to operate at a power of greater than 1 W/mm2.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and the operation of the various embodiments.

DETAILED DESCRIPTION

Referring generally to the figures, a method of forming an LED substrate and phosphor layer utilizing a high-silica content sintered substrate is shown and described. In general, the method disclosed herein utilizes a laser to sinter a phosphor material directly into a high-silica substrate. The high-silica content substrate has high $SiO_2$ purity, high thermal conductivity, low coefficient of the thermal expansion (CTE), and low thickness, which are believed suitable for high powered LED applications. By sintering the phosphor material directly to the substrate via the method discussed herein, heat generated during the photoluminescent conversion performed by the phosphor layer of the LED device is conducted away at a high rate, believed to result in a longer-lived LED device. In addition, the high rate of thermal conductivity and temperature capability of the high-silica content substrate are believed to allow the LED to operate higher power levels, which in turn generate brighter LEDs, while limiting heat-based damage and extending LED life. Further, in at least some embodiments, a glass cover layer is sealed over the phosphor layer and sealed to the substrate forming a highly hermetic seal. It is believed that this level of hermetic sealing improves LED device life by limiting moisture penetration into the device.

Figure 1:
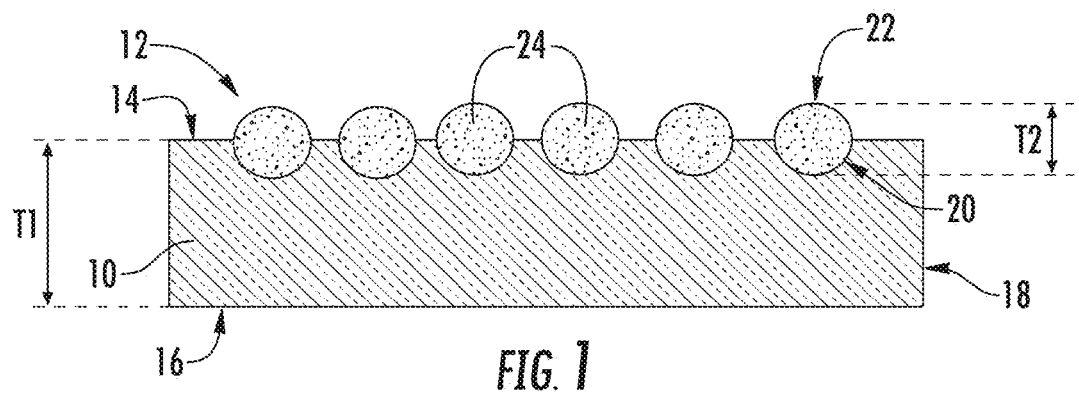
FIG. 1 shows a sectional view of an LED phosphor layer supported by a substrate according to an exemplary embodiment.

Referring to FIG. 1, a high-silica glass substrate, such as a fully sintered silica glass substrate, shown as substrate 10, is provided, and a phosphor containing layer, shown as phosphor layer 12, is applied onto substrate 10. In general, substrate 10 may be a sheet, chip, disc, rod, dome, etc., of any size and shape suitable for supporting components of an LED device, such as phosphor layer 12. As used herein, the term "substrate" generally refers to a substance, layer or material that may underlie or support something, or on which some process may occur. For example, the substrate may be a top layer, an exterior layer, an internal layer, etc., of a multilayered structure. In the embodiment shown in FIG. 1, substrate 10 acts as a lower substrate layer supporting phosphor layer 12.

Referring generally to FIG. 1, substrate 10 includes a first major surface, shown as upper surface 14, and a second major surface, shown as lower surface 16, that is on the opposite side of substrate 10 from upper surface 14. Substrate 10 includes an outer perimeter surface, shown as sidewall surface 18, that extends between outer most edges of upper surface 14 and lower surface 16. In various embodiments, upper surface 14 and/or lower surface 16 of substrate 10 may include a non-flat or non-polished surface texture or profile that includes a plurality of raised features and recessed features, which may create an irregular surface profile or repeating surface profile along substrate 10. In various embodiments, upper surface 14 and/or lower surface 16 are primarily unpolished such that the surface has a surface roughness Ra of greater than 1.5 angstrom for a 40 µm by 30 µm area thereon, which may be a subsection of the total area of the surface. In another embodiment, however, upper surface 14 and/or lower surface 16 may be a smooth or polished surface having a roughness Ra of less than 1.5 angstrom for a 40 µm by 30 µm area section.

Referring to FIG. 1, substrate 10 has a thickness, shown as T1, which generally is the distance between opposing portions of upper surface 14 and lower surface 16. In some embodiments discussed herein, T1 is a specific thickness between two opposing points along upper surface 14 and lower surface 16, and in other embodiments, T1 is an average thickness between all opposing points along upper surface 14 and lower surface 16. In some embodiments, sheet 12 has a thickness T1 of less than 200 µm, such as less than 100 µm, and in some such embodiments less than 50 µm. According to an exemplary embodiment, T1 is between 200 µm and 1 µm, specifically between 200 µm and 5 µm and more specifically between 150 µm and 5 µm. Thus, according to these exemplary embodiments, substrate 10 is formed as a particularly thin sheet of silica material that provides sufficient strength as an LED support substrate and low total weight, while also providing for high levels of thermal conductivity.

According to an exemplary embodiment, substrate 10 has a first minimum dimension orthogonal to the thickness (e.g., width, length, minimum surface dimension) and a second minimum dimension orthogonal to the thickness and orthogonal to the first minimum dimension. In various embodiments, the minimum orthogonal dimensions are each less than 100 m and greater than 1 mm. In various embodiments, substrate 10 may be a continuous ribbon or a discrete sheet of high-silica material.

In some embodiments, substrate 10 consists of at least 99% by weight, and more specifically at least 99.5% by weight, of a material of the composition of $(SiO_2)_{1-x-y} \cdot M'_x M''_y$, where either or both of M' and M" is an element (e.g., a metal), dopant, or substitution, which may be in an oxide form, or combination thereof, or is omitted, and where the sum of x plus y is less than 1, such as less than 0.5, or where x and y are 0.4 or less, such as 0.1 or less, such as 0.05 or less, such as 0.025 or less, and in some such embodiments greater than $1E^{-6}$ for either or both of M' and M". In some embodiments, the substrate is highly pure fuse quartz, such as at least 99.5% quartz, such as 99.9% quartz. Put another way, in some embodiments, the substrate is highly pure $SiO_2$, such as at least 99% $SiO_2$, such as 99.5% $SiO_2$, such as 99.9% $SiO_2$. In certain embodiments, substrate 10 is crystalline, and in some embodiments, substrate 10 is amorphous. In one embodiment, substrate 10 is a fully sintered silica glass material. In specific embodiments, substrate 10 is a fully sintered silica glass sheet having a density of greater than 2.1 g/cc, and specifically of about 2.2 g/cc (e.g., 2.2 g/cc plus or minus 1%). In specific embodiments, substrate 10 is a fully sintered silica glass sheet having a density of between 1.8 g/cc, and specifically of about 2.2 g/cc (e.g., 2.2 g/cc plus or minus 1%).

In various embodiments, substrate 10 has a high softening point temperature, that being greater than 700° C., such as greater than 800 C, such as greater than 900° C., such as greater than 1000° C., such as greater than 1100° C. In addition, substrate 10 has a low coefficient of thermal expansion, that being less than $10 \times 10^{-7}/°$ C. in the temperature range of 50 C to 300° C. The high softening point of substrate 10 allows substrate 10 to withstand high processing temperatures. The low coefficient of thermal expansion of substrate 10 provides structural and dimensional stability to the LED with changes in temperature, as may occur during manufacturing of the LED or in use of the LED.

In various embodiments, substrate 10 is a strong and flexible substrate which may allow the associated LED to be flexible or be formed into a curved shape. In various embodiments, substrate 10 is bendable such that the thin sheet bends to a radius of curvature of at least 500 mm without fracture when at room temperature of 25° C. In specific embodiments, substrate 10 is bendable such that the thin sheet bends to a radius of curvature of at least 300 mm without fracture when at room temperature of 25° C., and more specifically to a radius of curvature of at least 150 mm without fracture when at room temperature of 25° C. Bending of substrate 10 may also help with roll-to-roll applications, such as processing across rollers in automated manufacturing equipment, such as an LED manufacturing line. This may allow formation using high throughput manufacturing techniques such as those used in semiconductor processing.

In various embodiments, substrate 10 is a transparent or translucent sheet of fully sintered silica glass. In one embodiment, substrate 10 has a transmittance greater than 90% and more specifically greater 95%. The high transmittance may allow for laser application (as discussed below) during manufacturing from both the lower and upper surfaces of substrate 10. In various embodiments, substrate 10 also is light weight allowing a decrease in the total weight of the LED utilizing substrate 10.

As used herein, the silica ($SiO_2$) containing sheet may be a thin sheet of silica glass formed by fully sintering a silica soot sheet. In various embodiments, the silica soot sheet is formed by a system that utilizes one or more glass soot generating devices (e.g., a flame hydrolysis burner) that is directed or aimed to deliver a stream of glass soot particles on to a soot deposition plate. As noted above, the silica substrates discussed herein may include one or more dopants. In the example of a flame hydrolysis burner, doping can take place in situ during the flame hydrolysis process by introducing dopant precursors into the flame. In a further example, such as in the case of a plasma-heated soot sprayer, soot particles sprayed from the sprayer can be pre-doped or, alternatively, the sprayed soot particles can be subjected to a dopant-containing plasma atmosphere such that the soot particles are doped in the plasma. In a still further example, dopants can be incorporated into a soot sheet prior to or during sintering of the soot sheet. Example dopants include elements from Groups IA, IB, IIA, IIB, IIIA, IIIB, IVA, IVB, VA, VB and the rare earth series of the Periodic Table of Elements. In various embodiments, the silica soot particles may be doped with a variety of materials including germania, titania, alumina, phosphorous, rare earth elements, metals and fluorine.

As shown in FIG. 1, phosphor layer 12 generally defines an inner surface or boundary 20 and an outer surface or boundary 22. In general, phosphor layer 12 is applied directly onto substrate 10 such that inner boundary 20 directly interfaces with substrate surface 14. In this embodiment, no intervening layers are located between phosphor layer 12 and substrate 10. In various embodiments, it is believed that this direct contact between phosphor layer 12 and substrate 10 facilitates heat conduction away from phosphor layer 12, which in turn is believed to increase LED life. Phosphor layer 12 has an average thickness, shown as T2. As shown, T2 is the distance measured between opposing portions of phosphor layer surfaces 20 and 22. In various embodiments, T2 is between 5 μm and 70 μm. As will be understood, T2 is selected based on the desired output color for the LED.

In general, phosphor layer 12 may include any suitable phosphor materials. In some embodiments, phosphor layer 12 may be formed from a plurality of phosphor particles 24, and in specific embodiments, phosphor particles 24 range in size (e.g., diameter, maximum width, etc.) from 5 μm to 50 μm. In various embodiments, phosphor layer 12 includes at least one of garnets, nitrides silicates, sulfides, selenides, and oxy-nitrides. In a specific embodiment, phosphor layer 12 includes neodymium-doped yttrium aluminium garnet materials ("YAG").

In various embodiments, phosphor layer 12 includes a binder material supporting phosphor particles 24. In general, the binder material may be used to support phosphor particles 24 and facilitate application onto substrate 10. In one embodiment, the phosphor material may be mixed with the binder material which then may be applied to substrate 10. In another embodiment, the binder material may be applied to substrate 10, and phosphor particles 24 are then applied to the binder material. In various embodiments, the binder and/or binder-phosphor mixture may be applied using tape casting, 3D printing, spraying or other suitable application techniques.

In specific embodiments, phosphor layer 12 includes less than 10% of the binder material and/or greater than 90% phosphor material. In various embodiments, the binder material may be any suitable phosphor binder including one or more of KaSil (potassium silicate), sodium silicate, and other ceramic binders, such as zirconia. In some embodiments, the binder material may be sacrificial in that the binder is removed (e.g., burned, evaporated, etc.) during phosphor sintering, and in another embodiment, the binder material may remain and become embedded into substrate 10 following sintering.

Figure 2:
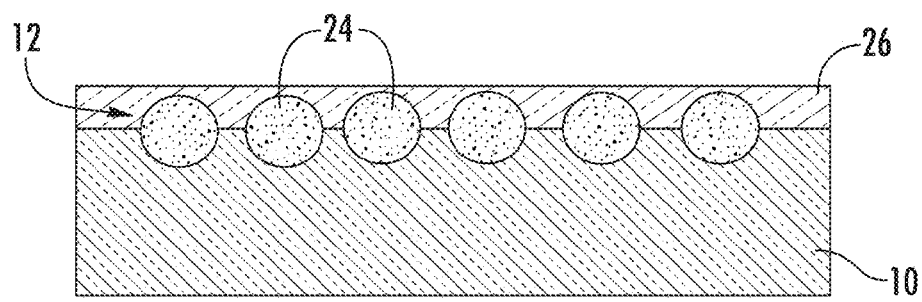
FIG. 2 shows a sectional view of a cover layer applied to the LED phosphor layer and substrate of FIG. 1 according to an exemplary embodiment.

Referring to FIG. 2, in at least some embodiments, a cover glass layer 26 is applied over phosphor layer 12 and supported by substrate 10. In such embodiments, cover glass layer 26 (at least following sintering) acts to hermetically seal phosphor layer 12 with substrate 10. This hermetic sealing provides a humidity or moisture barrier which increases the life of the associated LED device. In some embodiments, cover glass layer 26 is formed from a glass material that is different from substrate 10, and in another embodiment, cover glass layer 26 is formed from the same high-silica material, such as a fully sintered silica glass material, as substrate 10.

Figure 3:
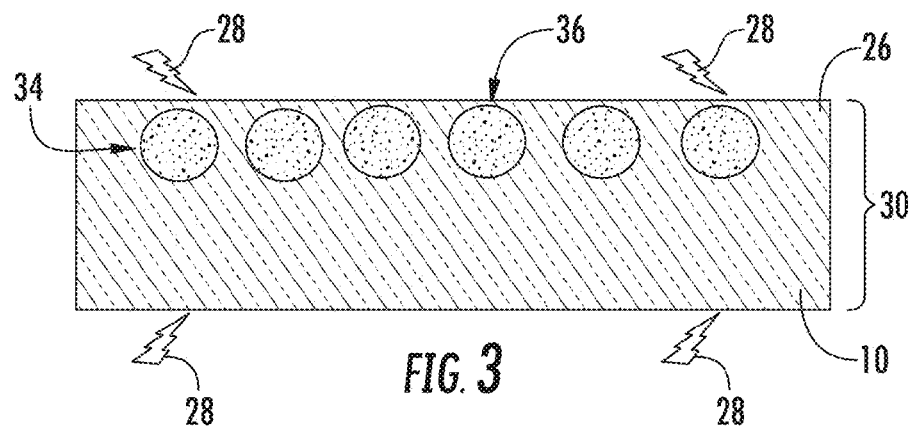
FIG. 3 shows a sectional view of the cover layer, LED phosphor layer and substrate of FIG. 2 during laser sintering according to an exemplary embodiment.

Referring to FIG. 3, substrate 10, phosphor layer 12 and cover glass layer 26 may be fused together via an application of laser energy, shown schematically as lasers 28. As will be generally understood, lasers 28 sinter the phosphor material of phosphor layer 12, and may also generally melt together substrate 10, phosphor layer 12 and cover glass 26 forming a phosphor embedded glass piece, shown as monolithic glass structure 30. As shown in FIG. 3, monolithic glass structure 30 is such that a distinct interface does not exist between the phosphor layer and the substrate (as may be present with thin film/substrate layers) and the phosphor particles of phosphor layer 12 are hermetically fused to substrate 10.

In a particular embodiment, lasers 28 are focused onto the interface between phosphor layer 12 and substrate 10, e.g., along the interface between upper substrate surface 14 and lower phosphor layer surface 20, shown in FIG. 1. In some embodiments, lasers 28 are directed onto phosphor layer 12 from the phosphor side of substrate 10. In other embodiments, lasers 28 are directed at the interface between substrate 10 and phosphor layer 12 from the opposing side (e.g., lower side in the orientation of FIG. 3) of substrate 10. In yet another embodiment, lasers 28 are directed onto phosphor layer 12 from both sides of substrate 10. While FIG. 3 shows cover glass layer 26 applied prior to sintering, in other embodiments, cover glass layer 26 is applied over phosphor layer 12 and supported by substrate 10 after sintering of phosphor layer 12.

During sintering of the phosphor material of phosphor layer 12, the density of phosphor layer 12 increases. In some embodiments, the phosphor material of phosphor layer 12 has an average particle size following sintering of between 50 nm and 2 μm. In some embodiments, the outermost surface monolithic structure 30 at the embedded phosphor layer 12 has a high RMS roughness, such as greater than 100 nm.

Further, in at least some embodiments, the laser energy causes the material of substrate 10 adjacent to upper surface 14 to soften such that an inner portion of phosphor layer 12 becomes embedded within a portion of the material of substrate 10 adjacent upper surface 14. As shown best in FIG. 4, this embedding process during sintering forms a transition zone or section 32 below the outermost sections of substrate 10 in which the material of substrate 10 becomes mixed with sintered phosphor material 34. Further, because of this mixing, the phosphor density of the sintered phosphor layer 34 increases as the distance to the outer surface 36 of the phosphor layer decreases. Put another way, the phosphor density and volume fraction of phosphor material within transition zone 38 decreases as the depth (e.g., in the z-direction) into substrate 10 increases.

Figure 4:
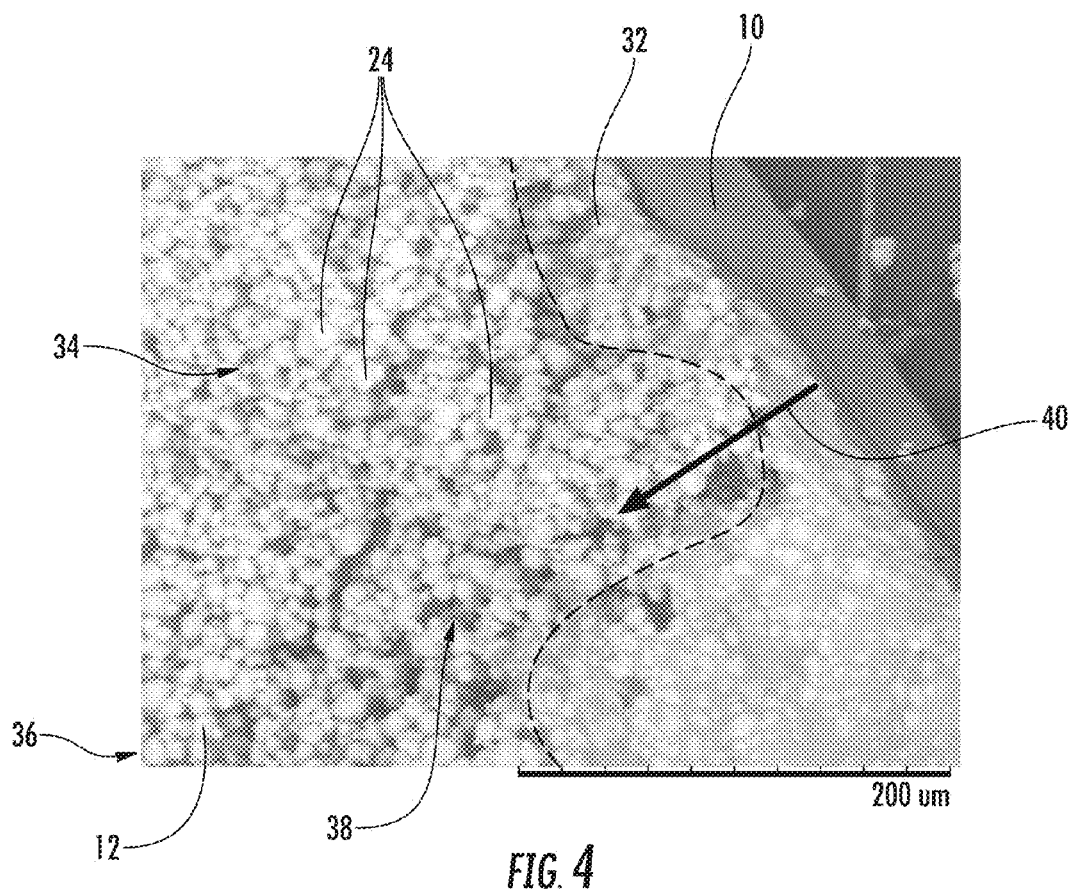
FIG. 4 is a magnified image of a cross-section of a sintered cover layer, LED phosphor layer and substrate according to an exemplary embodiment.

In this arrangement, as shown in FIG. 4, an external phosphor zone 38 exists between transition zone 32 and outer phosphor surface 36, and is located outside of the melted material of substrate 10. This direction of increasing phosphor density is shown generally by arrow 40 in FIG. 4, and can be seen in FIG. 4 as the somewhat blurry or mixed area within transition zone 32. It is believed that this close contact between sintered phosphor material 34 and substrate 10 within transition zone 32 facilitates heat transfer away from phosphor material during LED device operation. In specific embodiments, the fusion between substrate 10 and phosphors of phosphor layer 34 is more than 25%. In particular embodiments, the volume fraction of the phosphor material located on the surface of substrate 10 (e.g., within external phosphor zone 38) is more than 30% and as high as 80%, and preferably more than 40%, and the volume fraction of the phosphor material present decreases in the direction opposite of arrow 40 (e.g., the z-direction) e.g., within transition zone 32. In such embodiments, the volume fraction of the phosphor material embedded within substrate 10 (e.g., within transition zone) is between 20% and 70%, and preferably less than 60%, In various embodiments, within external phosphor zone 38, the phosphor material is homogeneously distributed on the surface of substrate 10, and, within transition zone 32, there is a distribution gradient in refractive index and particle count along the path of arrow 40 as may be determined by SEM imaging. In some embodiments, the distribution gradient in refractive index and particle count increases in direction of arrow 40, and in other embodiments, the distribution gradient in refractive index and particle count decreases in direction of arrow 40. Further, it is believed that this high level of fusion between sintered phosphor material 34 and substrate 10 may allow better light extraction and reduce air gaps for better efficiency of coupling excitation light from the LEDs into phosphor, reduced scattering, and other thermal benefits. In some embodiments, the density of phosphor within transition may decrease in the direction of arrow 40 when the sintering laser is directed through the substrate surface opposite of the surface supporting phosphor layer 12.

In various embodiments, lasers 28 may be a variety of suitable lasers. In various embodiments, lasers 28 may be CO2 lasers and may be directed onto phosphor layer 12 from either side of substrate 10. In various embodiments, lasers 28 may have a power density between 0.1 W/mm$^2$ and 100 W/mm$^2$. In specific embodiments, lasers 28 may deliver 100 Watts per 1 inch of line length and 1 mm line width, and may be directed across the substrate at 5 mm/sec. In various embodiments, lasers 28 may be formed by any suitable laser device, including line-scan lasers or Galvo lasers.

Figure 5:
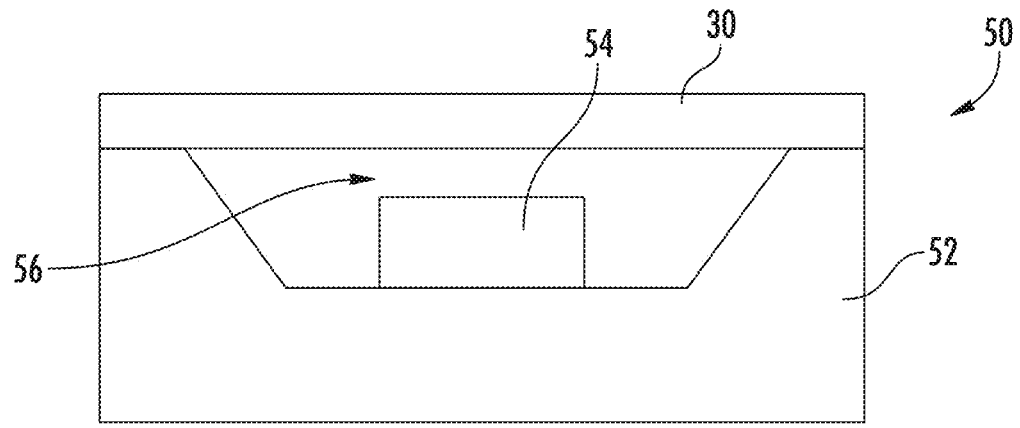
FIG. 5 is a schematic view of an LED device utilizing the sintered cover layer, LED phosphor layer and substrate of FIG. 3 according to an exemplary embodiment.
Figure 6:
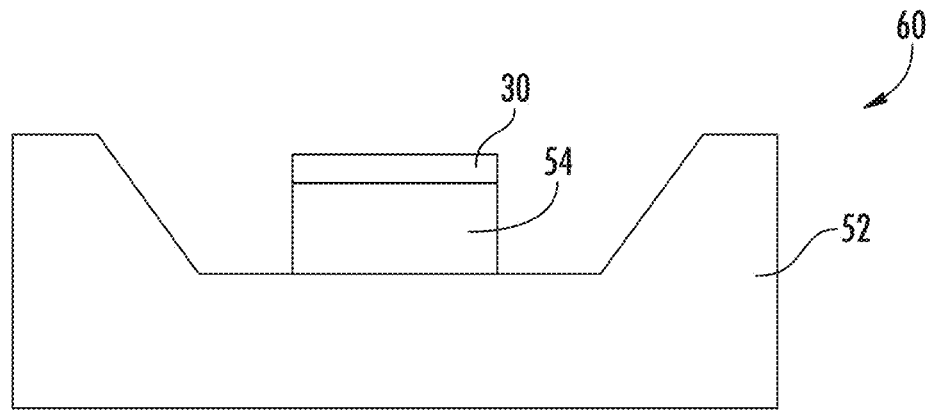
FIG. 6 is a schematic view of an LED device utilizing the sintered cover layer, LED phosphor layer and substrate of FIG. 3 according to another exemplary embodiment.

Referring to FIG. 5 and FIG. 6, various embodiments of an LED device including phosphor embedded glass are shown. In various embodiments, the LED device discussed herein is a silica-based, high-power light emitting diode device. Referring to FIG. 5, an LED device 50 is shown. LED device 50 includes a reflector 52, and one or more LEDs 54. Reflector 52 supports a monolithic phosphor embedded glass structure 30, as discussed above, positioned over LED 54, such that LED 54 is coupled to glass structure 30 via reflector 52. In this embodiment, the phosphor carrying structure, glass structure 30, is remote from LED 54 and does not contact LED 54. As shown in FIG. 5, a gap or space 56 is located between LED 54 and the lower surface of structure 30 resulting in the separation. In another embodiment, as shown in FIG. 6, monolithic phosphor embedded glass structure 30 is coupled directly to an outer surface of LED 54.

As will generally be understood, LEDs generate photons generally in the blue or UV wavelength portion of the spectrum, and the phosphor material absorbs some of the light from the LED and in turn releases photons in the yellow portion of the spectrum. The net result of the combination of the blue and yellow light is a white light appearance. In a particular embodiment, the material of substrate 10 provides a high level of UV light transmission, and in contrast to typical glass materials used in LED formation, substrate 10 allows for formation of LED devices that utilize LEDs that emit UV light at a wavelength less than 300 nm. In particular embodiments, because of the high heat transfer characteristics of the arrangement discussed herein, it is believed that the LED substrate/phosphor arrangement discussed herein allows for use of LED devices that operate at power range of 0.1 Watt to greater than 50 Watts, and in a particular embodiment, the LED device discussed herein is configured to operate at a power of greater than 1 W/mm$^2$.

In various embodiments, the LED device discussed herein may include compositional gradients which prevent cracking during the cool down segment of LED fabrication. In addition, the LED device may include index modifiers within the material of substrate 10, such as titania, alumina, germania, etc., which may provide higher extraction. In some embodiments, the LED device may include surface texturing or dopants (such as air) that may provide for better light-coupling out of the LED device. In some embodiments, the LED device discussed herein may include thermal conductivity additives (such as diamond) to improve thermal performance. In some embodiments, substrate 10 could be 'remote' (e.g., separated by air, separated by an inert gas, separated by vacuum, etc.) from the LED, as shown in FIG. 5.

Thus, it is believed that, at least in some embodiments, the LED and substrate/phosphor arrangement discussed herein provides various improvements over conventional LED arrangements. Such improvements may include high power, improved lifetime, improved heat management, higher efficiency, better color uniformity, ability to make lower wavelength UV, and Hg-free.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A method of forming a light-emitting diode device comprising:
   providing a high-silica content, sintered glass substrate comprising:
   a first major surface;
   a second major surface opposite the first major surface;
   at least 99% $SiO_2$ by weight;
   an average thickness between the first major surface and the second major surface of less than 200 μm; and
   a minimum dimension orthogonal to the thickness that is less than 100 m and greater than 1 mm;
   applying a phosphor containing layer directly onto the first major surface such that at least some of a phosphor material of the phosphor containing layer directly contacts the first major surface;
   providing a sintering laser positioned to direct a laser beam onto the phosphor containing layer;
   sintering the phosphor material of the phosphor containing layer by delivering a laser beam from the sintering laser to the phosphor containing layer forming a sintered phosphor layer, wherein during sintering at least a portion of the substrate softens such that an inner portion of the sintered phosphor layer embeds in a transition section of the substrate below and adjoining the first major surface;
   applying a cover glass layer over the phosphor containing layer; and
   coupling a light-emitting diode to the substrate.

2. The method of claim 1, wherein the phosphor material of the phosphor containing layer has an average particle size following sintering of between 50 nm and 2 μm.

3. The method of claim 1, wherein, within the transition section of the substrate, the density of sintered phosphor layer increases as the distance to an outer surface of the sintered phosphor layer decreases.

4. The method of claim 1, wherein the phosphor containing layer includes a binder material supporting the phosphor material.

5. The method of claim 4, wherein 10% or less of the phosphor containing layer is binder material.

6. The method of claim 5, wherein the phosphor containing layer has a thickness between 5 μm and 70 μm, and the phosphor material of the phosphor containing layer comprises a plurality of phosphor material particles having a maximum width of between 5 μm and 50 μm.

7. The method of claim 1, wherein the substrate consists of at least 99.5% $SiO_2$ by weight, wherein the substrate is formed from a glass of $(SiO_2)_{1-x-y} \cdot M'_x M''_y$ composition, where either or both of M' and M'' is an element, dopant, or substitution, which may be in an oxide form, or combination thereof, or is omitted, and where the sum of x plus y is less than 1, wherein the substrate has a thickness less than 100 μm.

8. The method of claim 1, wherein the laser beam has a power density between 0.1 W/mm$^2$ and 100 W/mm$^2$, and the sintering step comprises focusing the laser beam at an interface between the phosphor containing layer and the first major surface of the substrate, wherein the substrate bends to a radius of curvature of at least 500 mm without fracture when at room temperature of 25 C, wherein the substrate has a softening point temperature greater than 700° C., wherein the substrate has a low coefficient of thermal expansion less than $10 \times 10^{-7}/°$ C. in the temperature range of 50 to 300° C., wherein the phosphor material comprises at least one of garnets, nitrides, silicates, sulfides, selenides, and oxy-nitrides.

9. The method of claim 1, wherein the sintering laser is directed through the second major surface of the substrate at an interface between the phosphor containing layer and the first major surface of the substrate.

10. A method of forming a light-emitting diode device comprising:
    providing a high-silica content, fully-sintered glass substrate comprising:
    a first major surface;
    a second major surface opposite the first major surface;
    at least 99% $SiO_2$ by weight;
    a density greater than 1.8 g/cc and less than about 2.2 g/cc; and
    an average thickness between the first major surface and the second major surface of less than 100 μm;
    wherein the substrate bends to a radius of curvature of at least 500 mm without fracture when at room temperature of 25 C, wherein the substrate has a softening point temperature greater than 1100° C., wherein the substrate has a low coefficient of thermal expansion less than $10 \times 10^{-7}/°$ C. in the temperature range of 50 to 300° C.;
    applying a phosphor material onto the first major surface of the substrate, the phosphor material comprising phosphor particles having a maximum width of between 5 μm and 50 μm;
    sintering the phosphor material directly onto the first major surface of the substrate by directing a laser beam onto an interface between the phosphor material and the first major surface forming a sintered phosphor layer; and
    coupling a light-emitting diode and the substrate together.

11. The method of claim 10, further comprising softening the substrate with the laser beam such that at least a portion of the sintered phosphor layer becomes embedded in and surrounded by the material of the substrate.

12. The method of claim 11, wherein the phosphor material has an average particle size following sintering of between 50 nm and 2 μm.

13. The method of claim 12, wherein the portion of the sintered phosphor layer embedded in the substrate has a density that increases as the depth of the embedded phosphor layer decreases.

14. The method of claim 13, wherein the phosphor material is supported by a binder material and the binder material and phosphor material are applied together to the first major surface of the substrate.

15. The method of claim 14, wherein the laser beam has a power density between 0.1 W/mm² and 100 W/mm², wherein the phosphor material comprises at least one of garnets, nitrides, silicates, sulfides, selenides, and oxy-nitrides.

16. The method of claim 15, wherein the light-emitting diode is a high power light emitting diode operating at a power of greater than 1 W/mm².

17. A silica-based, high-power light emitting diode device comprising:
- a high-silica content, sintered glass substrate comprising:
  - a first major surface;
  - a second major surface opposite the first major surface;
  - at least 99% SiO₂ by weight;
  - an average thickness between the first major surface and the second major surface of less than 200 μm; and
  - a minimum dimension orthogonal to the thickness that is less than 100 m and greater than 1 mm;
- a sintered phosphor layer located on and embedded into the substrate at the first major surface, the sintered phosphor layer comprising:
  - an outer surface;
  - an inner boundary located within the substrate and below the first major surface;
  - a transition zone extending from the inner boundary a portion of the distance towards the outer surface, wherein the transition zone comprises sintered phosphate material embedded in the material of the substrate; and
  - an external phosphor zone extending from the transition zone to the outer surface, wherein the external phosphor zone is located outside of the material of the substrate; and
- a light-emitting diode device coupled to the substrate, the light emitting diode device configured to operate at a power of greater than 1 W/mm².

18. The silica-based, high-power light emitting diode device of claim 17, wherein the sintered phosphor layer has a thickness of 5 μm and 70 μm, wherein between 20% and 70% of the sintered phosphor layer is located within the transition zone.

19. The silica-based, high-power light emitting diode device of claim 18, wherein, within the transition zone, the density of sintered phosphor layer increases as the distance to the outer surface of the sintered phosphor layer decreases.

20. The silica-based, high-power light emitting diode device of claim 19, wherein the substrate bends to a radius of curvature of at least 500 mm without fracture when at room temperature of 25 C, wherein the substrate has a softening point temperature greater than 1100° C., wherein the substrate has a low coefficient of thermal expansion less than $10 \times 10^{-7}$/° C. in the temperature range of 50 to 300° C., wherein a phosphor material of the sintered phosphor layer comprises at least one of garnets, nitrides silicates, sulfides, selenides, and oxy-nitrides, wherein the substrate is fully sintered having a density greater than 1.8 g/cc and less than about 2.2 g/cc.

* * * * *

UNITED STATES PATENT AND TRADEMARK OFFICE
CERTIFICATE OF CORRECTION

PATENT NO. : 9,859,477 B2
APPLICATION NO. : 15/403912
DATED : January 2, 2018
INVENTOR(S) : Daniel Warren Hawtof et al.

It is certified that error appears in the above-identified patent and that said Letters Patent is hereby corrected as shown below:

In the Specification

Column 1, Line 60:
"at room temperature of 25 C. The substrate has a softening"
Should read:
--at room temperature of 25° C. The substrate has a softening--;

Column 4, Line 50:
"greater than 800 C, such as greater than 900° C, such as"
Should read:
--greater than 800° C, such as greater than 900° C, such as--;

Column 5, Line 13:
"90% and more specifically greater 95%. The high transmit-"
Should read:
--90% and more specifically greater than 95%. The high transmit- --;

In the Claims

Column 10, Claim 8, Line 13:
"when at room temperature of 25 C, wherein the substrate has"
Should read:
--when at room temperature of 25° C, wherein the substrate has--;

Column 10, Claim 10, Line 38:
"temperature of 25 C, wherein the substrate has a"
Should read:
--temperature of 25° C, wherein the substrate has a--; and Signed and Sealed this
Twenty-second Day of May, 2018

Andrei Iancu
*Director of the United States Patent and Trademark Office*

Column 12, Claim 20, Line 20:
"room temperature of 25 C, wherein the substrate has a"
Should read:
--room temperature of 25° C, wherein the substrate has a--.